(12) United States Patent
Kanno

(10) Patent No.: US 7,079,219 B2
(45) Date of Patent: Jul. 18, 2006

(54) METHOD FOR MANUFACTURING SEMICONDUCTOR DEVICE AND EXPOSURE SYSTEM

(75) Inventor: Masahiro Kanno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 10/932,077

(22) Filed: Sep. 2, 2004

(65) Prior Publication Data

US 2005/0079428 A1    Apr. 14, 2005

(30) Foreign Application Priority Data

Sep. 2, 2003    (JP) .............................. 2003-310273

(51) Int. Cl.
G03B 27/68    (2006.01)
G03B 27/52    (2006.01)

(52) U.S. Cl. .......................................... 355/52; 355/55

(58) Field of Classification Search ................. 355/30, 355/52, 53, 55, 77; 430/311; 356/399–401; 250/548
See application file for complete search history.

(56) References Cited

U.S. PATENT DOCUMENTS 4,650,983 A * 3/1987 Suwa ......................... 250/204
4,687,322 A * 8/1987 Tanimoto et al. ............. 355/55
4,825,247 A * 4/1989 Kemi et al. .................... 355/55
4,998,821 A * 3/1991 Ohta et al. ................... 353/122
5,721,608 A * 2/1998 Taniguchi ..................... 355/53
6,440,616 B1    8/2002 Izuha et al.
6,614,503 B1    9/2003 Uzawa
RE38,320 E    11/2003 Nishi et al.

FOREIGN PATENT DOCUMENTS

JP    10-289865    10/1998

* cited by examiner

Primary Examiner—Henry Hung Nguyen

(57) ABSTRACT

A method for manufacturing a semiconductor device, including obtaining a first dimension difference or ratio which shows a dimension difference or ratio of a latent images of a first and a second focus monitor marks, or a dimension difference or ratio of a first and a second focus monitor marks, calculating a first defocus value based on the first dimension difference or ratio, obtaining second characteristic showing defocus value characteristic for a pressure inside a chamber based on pairs of the pressure and defocus value, measuring the pressure, predicting the defocus value based on the measured pressure and the second characteristic, correcting the relationship between a focus position of an exposure light and a position on the optical axis of the second resist film in accordance with the predicted defocus value, and forming the latent image of the circuit pattern on the second photo resist film.

14 Claims, 5 Drawing Sheets

METHOD FOR MANUFACTURING SEMICONDUCTOR DEVICE AND EXPOSURE SYSTEM

CROSS-REFERENCE TO RELATED APPLICATIONS

This application is based upon and claims the benefit of priority from prior Japanese Patent Application No. 2003-310273, filed Sep. 2, 2003, the entire contents of which are incorporated herein by reference.

BACKGROUND OF THE INVENTION

1. Field of the Invention

The present invention relates to a method for manufacturing a semiconductor device which takes into consideration variations in focus due to pressure changes, and also relates to an exposure system.

2. Description of the Related Art

A semiconductor manufacturing apparatus called an exposure apparatus is used in the photolithography process for manufacturing semiconductor devices. The exposure apparatus transfers a circuit pattern which is drawn on a photo mask onto a semiconductor wafer. There is constant demand for this circuit pattern to be miniaturized, and in response to this demand, there have been improvements in the exposure apparatus. However, the demand for miniaturization has been even more pressing in recent years. In order to form a miniaturized circuit pattern, control of the circuit pattern dimensions has become very strict. One factor which causes variation in the pattern dimensions is focus error in the exposure apparatus, or in other words defocusing.

In the exposure apparatus mechanism, the focus position varies due to pressure variations. Because of this, the exposure apparatus performs correction of the focus position in accordance with pressure (Jpn. Pat. Appln. KOKAI Publication No. 10-289865 publication). In the prior art, the defocus value is estimated assuming that the pressure and the focus position are proportional to each other, and defocus correction is performed based on the estimated defocus value. However, the details of the relationship between the pressure and the focus position are not known. Consequently, detailed focus correction cannot be performed in accordance with pressure variation, and thus defocusing sometimes occurs.

As described above, there is the problem that details of the relationship between the pressure and the focus position are not known, and thus the accuracy of the defocus value that is predicted from the pressure is low, and detailed focus correction based on the pressure cannot be performed.

BRIEF SUMMARY OF THE INVENTION

According to one aspect of the present invention, there is provided a method for manufacturing a semiconductor device, comprising: a step of preparing a photo mask on which first and second focus monitor patterns for forming latent images of first and second focus monitor marks on a photo resist film, and a circuit pattern on a mask for forming latent images of the circuit pattern on the photo resist film are disposed; a step of preparing first characteristics which show the defocus value characteristics of exposure light for a dimension difference or ratio of the latent image of the first focus monitor mark and the latent image of the second focus monitor mark, or a dimension difference or ratio of the first focus monitor mark and the second focus monitor mark obtained from developing the photo resist film on which the latent image for the mark is formed; a step of disposing inside an exposure chamber of an exposure apparatus, a first wafer on which the first photo resist film is formed; a step of forming latent images of the first and second focus monitor marks on the first photo resist film; a step of obtaining a first dimension difference or ratio which shows the dimension difference or ratio of the latent image of the first focus monitor mark and the latent image of the second focus monitor mark formed on the first photo resist film, or the dimension difference or ratio of the first focus monitor mark and the second focus monitor mark obtained by developing the first photo resist film on which the latent image is formed; a step of calculating a first defocus value based on the first dimension difference or ratio of the first characteristics; a step of calculating the first defocus value based on a plurality of atmosphere pressures or on a plurality of pressure states in the exposure chamber, and obtaining second characteristics showing defocus value characteristics for the atmosphere pressures or the pressure values inside the exposure chamber; a step of disposing a second wafer on which the second photo resist film is formed, in the exposure chamber; a step of measuring the atmosphere pressure or the pressure inside the exposure chamber either before or after the second wafer has been disposed; a step of predicting the defocus value based on the measured pressure value and the second characteristics; a step of correcting the relationship between the focus position of the exposure light and the position on the optical axis of the exposure light of the second resist film in accordance with the predicted defocus value; and a step of forming the latent image for the first and second focus monitor marks and the latent image for the circuit pattern on the second photo resist film after the correction.

According to another aspect of the present invention, there is provided an exposure system comprising: a storage section which stores first characteristics which show defocus value characteristics for a dimension difference or ratio of latent images of first and second focus monitor marks which are obtained by transferring first and second focus monitor patterns to a photo resist film, or defocus value characteristics of exposure light for a dimension difference or ratio of the first and second focus monitor marks obtained by developing the photo resist film on which the latent image for the mark is formed, with respect to the photo mask on which first and second focus monitor patterns and a circuit pattern are disposed; an exposure apparatus comprising an exposure chamber in which a light source of the exposure light, a mask stage for mounting the photo mask; an optical projection system; and a wafer stage for mounting the wafer are accommodated, and an adjustment mechanism which adjusts the relationship between the focus position of the exposure light and the position on the optical axis of the exposure light source of the wafer; a pressure gauge which measures the atmosphere pressure or the pressure inside the exposure chamber; a defocus value calculation section which calculates a defocus value corresponding to the dimension difference or ratio of the first and second focus monitor latent image patterns formed on the photo resist film on the wafer, or to the dimension difference or ratio of the first and second focus monitor marks, based on the first characteristics recorded in the storage section; an extraction section which extracts second characteristics for the defocus value corresponding to the pressure value, based on a plurality of pairs of data sets of the pressure value measured by the pressure gauge and the defocus value calculated by the defocus value calculation section; a prediction section which predicts the defocus value corresponding to the pressure value measured by the pressure gauge based on the second characteristics extracted by the extraction section; and a correction instruction section which calculates a correction value from the defocus value predicted by the prediction section and gives correction value instructions to the adjustment mechanism.

DETAILED DESCRIPTION OF THE INVENTION

An embodiment of the present invention will be described in the following with reference to the drawings.

Figure 1:
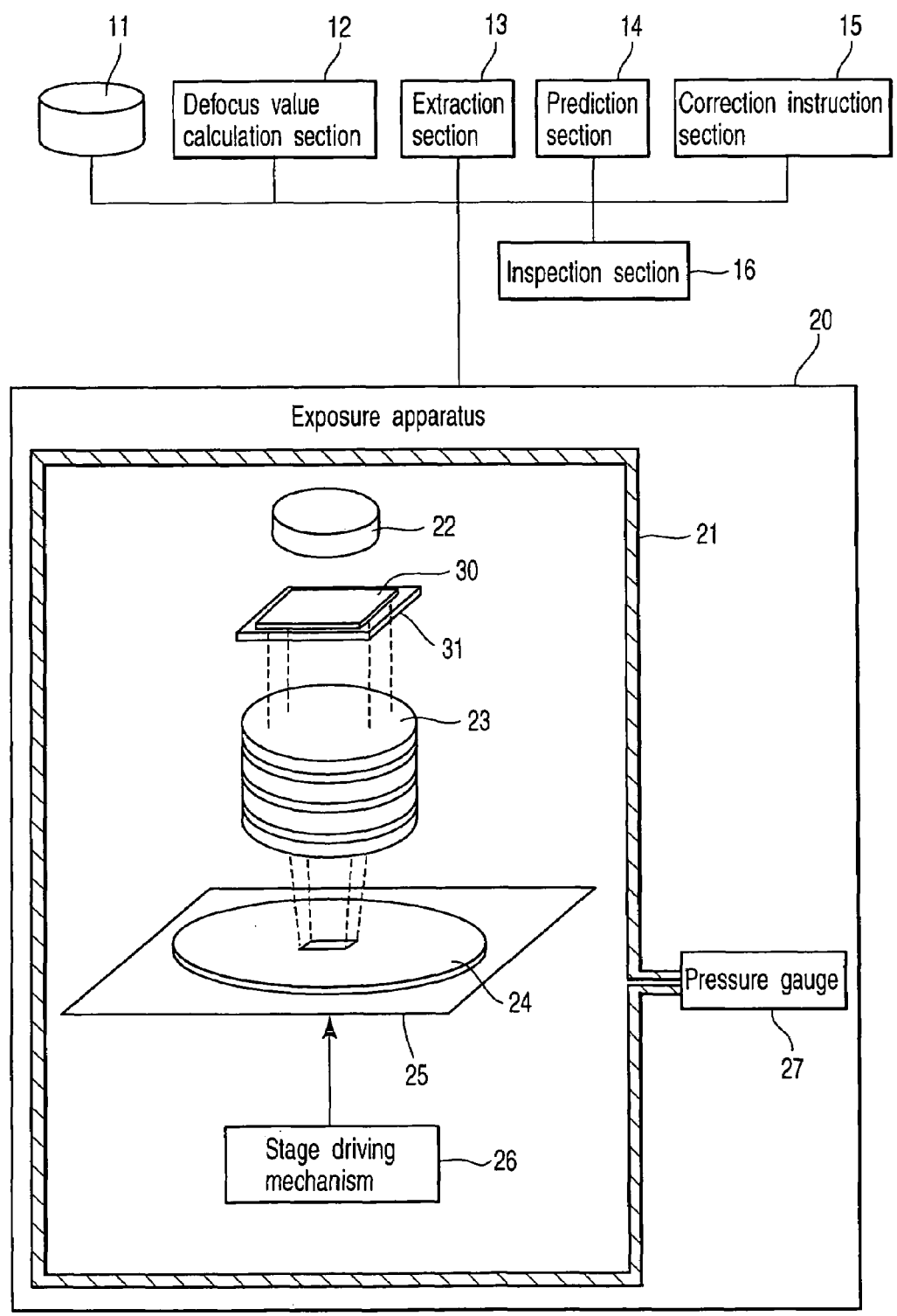
FIG. 1 is a diagram showing a configuration of an exposure system according to an embodiment of the present invention.

FIG. 1 is a diagram showing a configuration of an exposure system according to an embodiment of the present invention. In FIG. 1, notation 11 is a recording section (storage section) such as a hard disk; notation 12 is a defocus value calculation section; notation 13 is an extraction section; notation 14 is a prediction section; notation 15 is a correction instruction section; notation 16 is a inspection section; notation 20 is an exposure apparatus; notation 21 is a chamber (exposure chamber); notation 22 is an illumination optical system; notation 23 is a projection lens; notation 24 is a wafer; notation 25 is a wafer stage; notation 26 is a stage driving mechanism (adjustment mechanism); notation 27 is a pressure gauge; notation 30 is a photo mask; and notation 31 is a mask stage. The stage driving mechanism 26 adjusts the horizontal direction, the vertical direction, and the tilt of the wafer stage 25.

Figure 2:
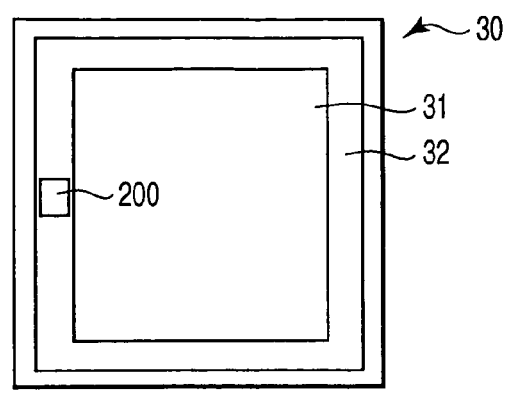
FIG. 2 is a plan view showing a configuration of a photo mask according to the embodiment of the invention.

The configuration of the photo mask 30 will be described with reference to FIG. 2. FIG. 2 is a plan view showing a configuration of a photo mask according to an embodiment of the present invention.

As shown in FIG. 2, the photo mask 30 comprises a device pattern region 31 for transferring a semiconductor element pattern to the wafer. The photo mask 30 has a dicing region 32 along the periphery of the device pattern region 31. A focus monitor pattern region 200 is formed in the dicing region 32. Two types of focus monitor patterns are formed in the focus monitor pattern region 200.

Figure 3A:
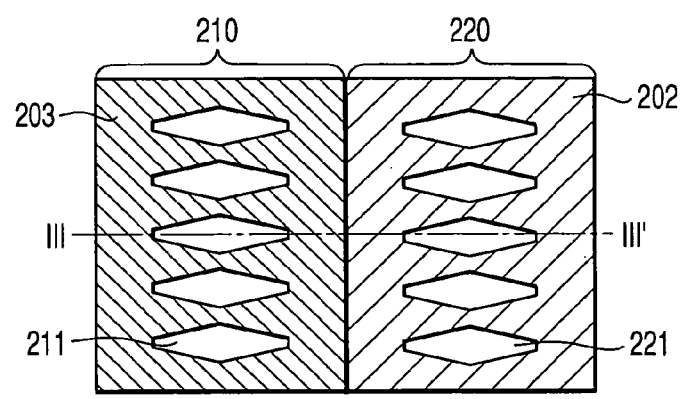
FIG. 3A is a plan view showing a configuration of a focus monitor pattern.
Figure 3B:
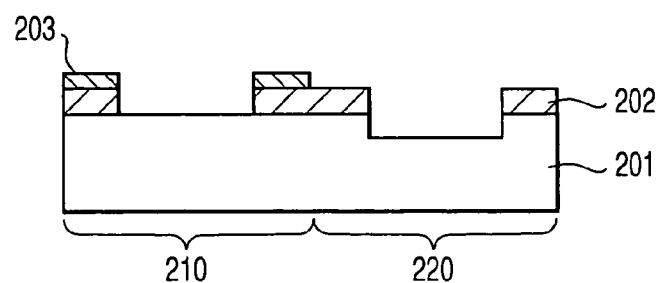
FIG. 3B is a cross-sectional view taken along the line III–III' of FIG. 3A.

The configuration of the focus monitor patterns will be described using FIGS. 3A and 3B. FIG. 3A is a plan view showing the configuration of the focus monitor pattern, and FIG. 3B is a cross-sectional view taken along the line III–III' of FIG. 3A. 201 in the figure is a transparent substrate of glass or the like; 202 is a translucence film of $SiO_2$ or the like; and 203 is a shield film of Cr and the like.

Furthermore, notation 211 is a diamond-shaped pattern (first focus monitor pattern) enclosed by the shield film 203 and the translucence film 202, and notation 221 is a diamond-shaped pattern (second focus monitor pattern) enclosed by the translucence film 202. The translucent film 202 has a transmittance of 6% for exposure light and has the effect of shifting the phase thereof by 180 degrees. The transparent substrate 201 is dug out at the diamond-shaped pattern 221 portion for providing phase difference of 90 degrees to the exposure light which passes through the translucence film 202 and the exposure light which passes through the aperture 221.

Five patterns are disposed at a substantially equal pitch in each of the first pattern region 210 in which the diamond-shaped pattern 211 is formed and the second pattern region 220 in which the diamond-shaped pattern 221 is formed.

By shifting the phase of the exposure light which passes through the translucence film 202 and the exposure light which passes through the aperture 221 by approximately 90 degrees, a focus point of a projection image for the pattern 211 enclosed the shield film and a focus point of a projection image for the pattern 221 enclosed the translucence film are offset. Consequently, a latent image of a focus monitor mark corresponding to the pattern 221 and a latent image of a focus monitor mark corresponding to the pattern 211 which are formed on the resist film show different dimension characteristics for defocusing. In addition, the difference in the two focus monitor mark dimensions which are measured after exposure or development, decrease monotonously or increase monotonously with respect to defocusing. A characteristic of the pattern dimension difference with respect to the defocus value can be obtained as a calibration curve. The focus shift can be monitored based on the difference in the two focus monitor mark dimensions after exposure or development and on the calibration curve and includes the direction.

For example, the dimensions are measured for the focus monitor marks formed by developing the photo resist film onto which the diamond-shaped patterns 211 and 221 have been transferred. In addition, the difference between the longitudinal axis direction dimension L of the focus monitor mark corresponding to the diamond-shaped pattern 211 of the shield film and the longitudinal axis direction dimension L' of the focus monitor mark corresponding to the diamond-shaped pattern 221 of the translucence film can be obtained.

Figure 4:
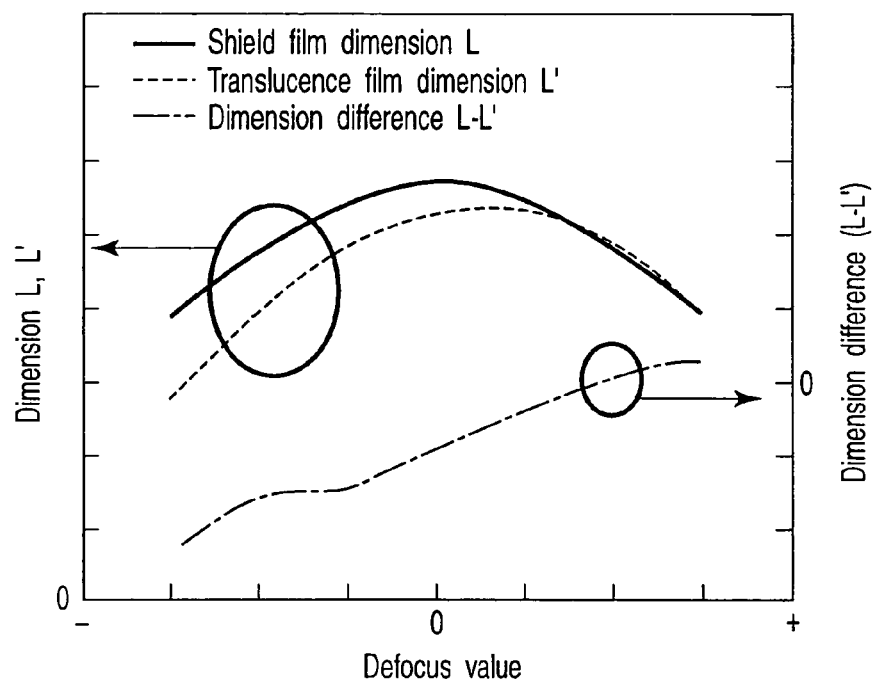
FIG. 4 is a view showing defocus characteristics of focus monitor mark dimensions L, L' and dimension difference (L–L')

FIG. 4 shows the defocus value characteristics (calibration curve and first characteristic) for the dimension difference (L–L') obtained by the exposure light. In this graph, the x-axis shows the defocus value and the y-axes show the focus monitor mark dimensions (L or L') and the dimension difference. Of the three curves, the solid curve shows the dimension L of the pattern of the focus monitor mark corresponding to the diamond-shaped pattern 211 enclosed the shield film; the broken curve shows the dimension L' of the pattern of the diamond-shaped mark corresponding to the diamond-shaped pattern 221 enclosed the translucence film; and the dotted chain curve shows the dimension difference obtained by subtracting the dimension L' of the focus monitor mark corresponding to the diamond-shaped pattern 221 enclosed the translucence film from the dimension L of the focus monitor mark corresponding to the diamond-shaped pattern 211 enclosed the shield film. Because these dimension difference characteristic increase monotonously with respect to defocus, the amount of the shift in the focus position can be obtained to include sign.

The dimension difference characteristic (dotted chain curve) corresponding to the defocus values shown in FIG. 4, are stored in the recording section 11 as an approximation formula.

Figure 5A:
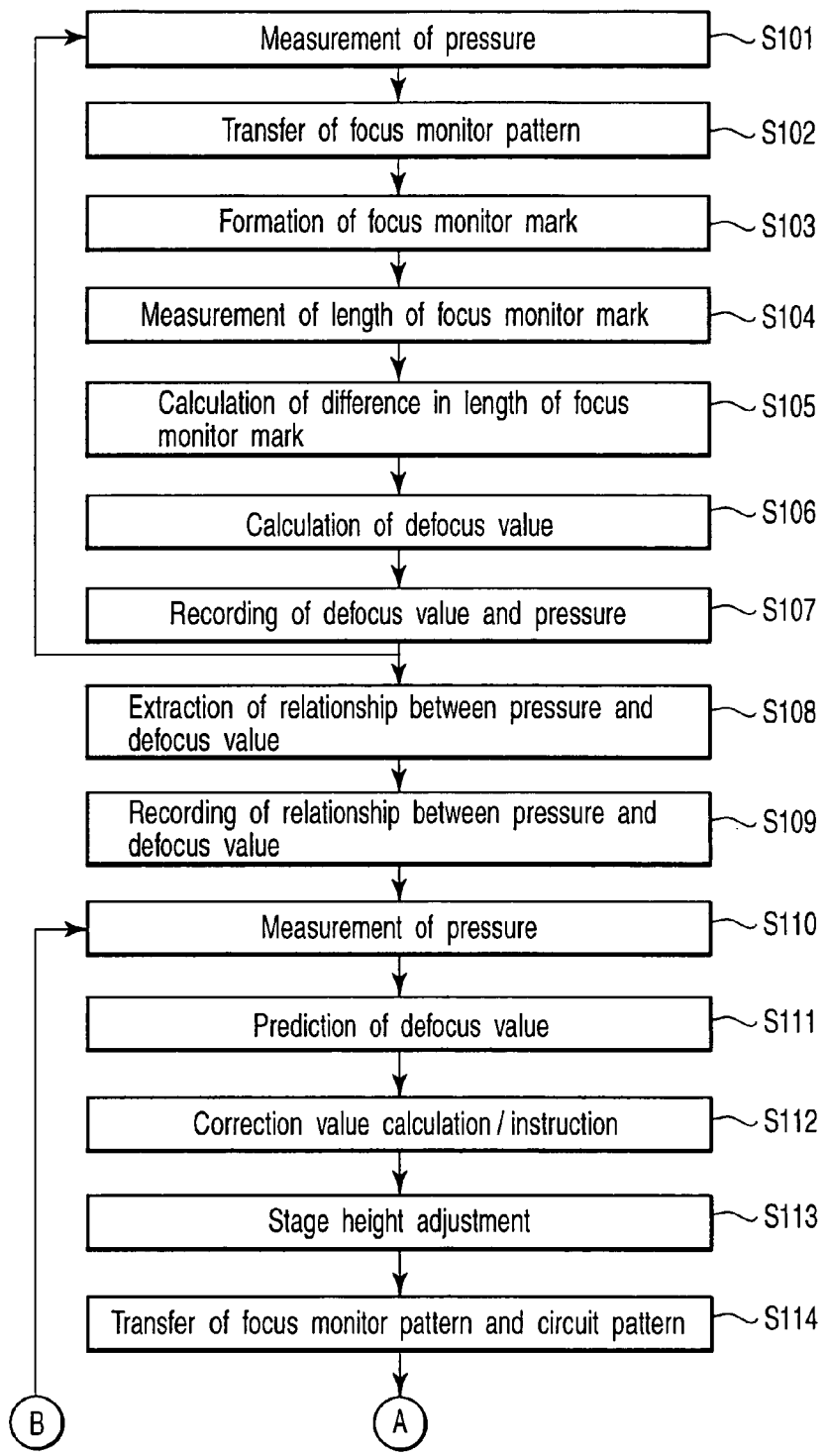
FIGS. 5A and 5B is a flowchart showing procedures in a method for manufacturing a semiconductor device according to the embodiment of the invention.
Figure 5B:
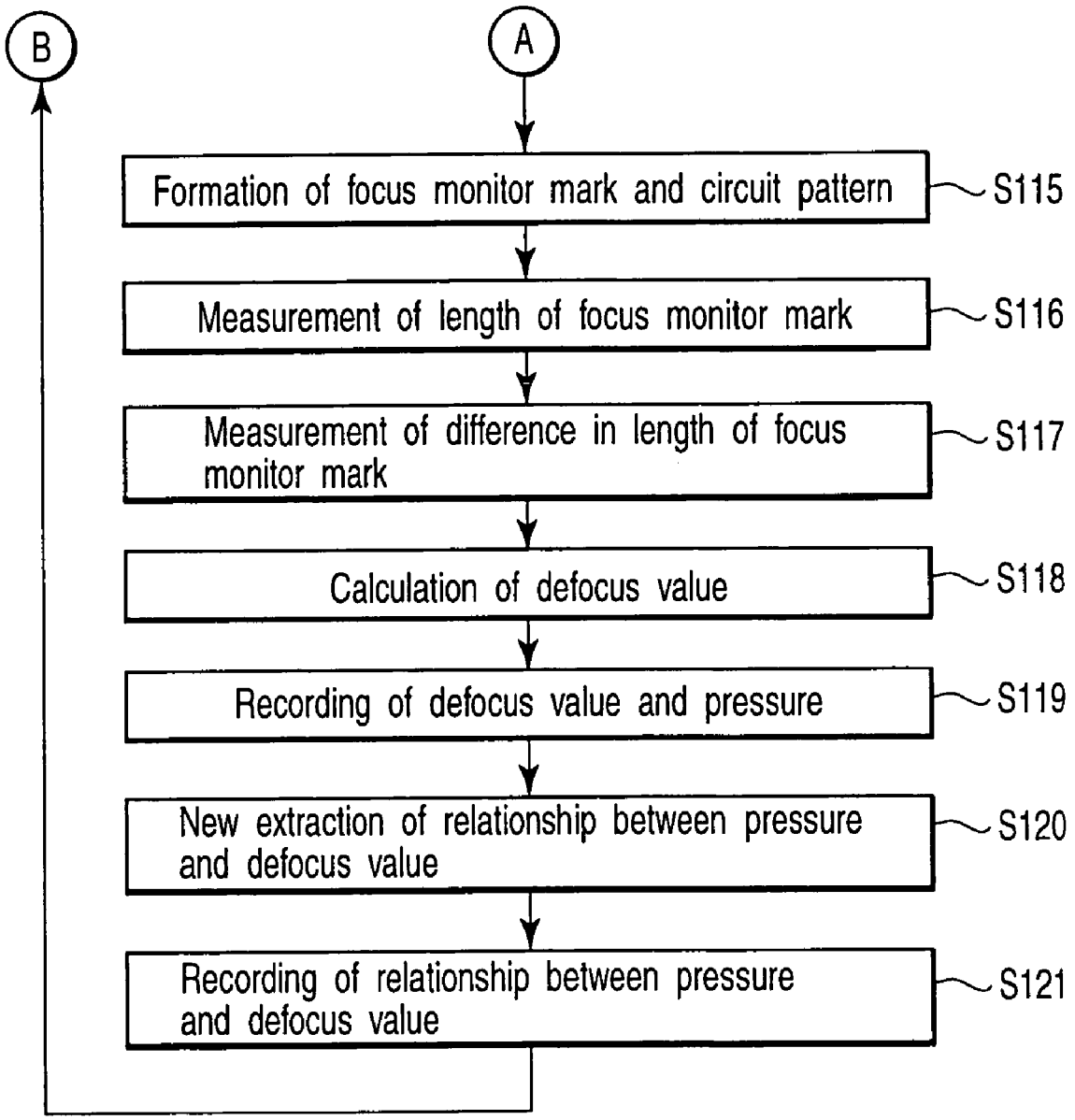

Next, a method for manufacturing a semiconductor device using defocus correction which takes atmosphere pressure variation into consideration will be described with reference to FIGS. 5A and 5B. FIGS. 5A and 5B are flowcharts showing procedures in the method for manufacturing a semiconductor device according to an embodiment of the present invention.

A wafer (first wafer) which has a photo resist film (first photo resist film) formed on the surface thereof is conveyed into the chamber 21 of the exposure apparatus 20, and then the pressure in the chamber 21 is measured by using the pressure gauge 27 (Step S101). Next, the focus monitor pattern 200 is transferred to the photo resist film on the wafer, and a latent image of the focus monitor mark is formed on the photo resist film (Step S102). The wafer is taken out of the chamber 21 and subjected to post-exposure baking (PEB) and development processing, and focus monitor marks comprising 2 types of diamond-shaped patterns are formed (Step S103).

Next the 2 types of focus monitor marks having lengths L, L' which are on the wafer that has been developed is measured by using the inspection instrument 16 such as an optical line-width measuring apparatus (Step S104). The results of the measurement are sent to the defocus value calculation section 12. The defocus value calculation section 12 obtains the dimension difference ΔL (=L−L') for the two types of focus monitor marks which were measured (Step S105). The defocus value calculation section 12 determines the defocus value corresponding to the obtained dimension difference ΔL, based on the defocus value characteristic for the dimension differences recorded in the recording section 11 (Step S106). A combination of the pressure value and the defocus value is recorded in the recording section 11 (Step S107).

Figure 6:
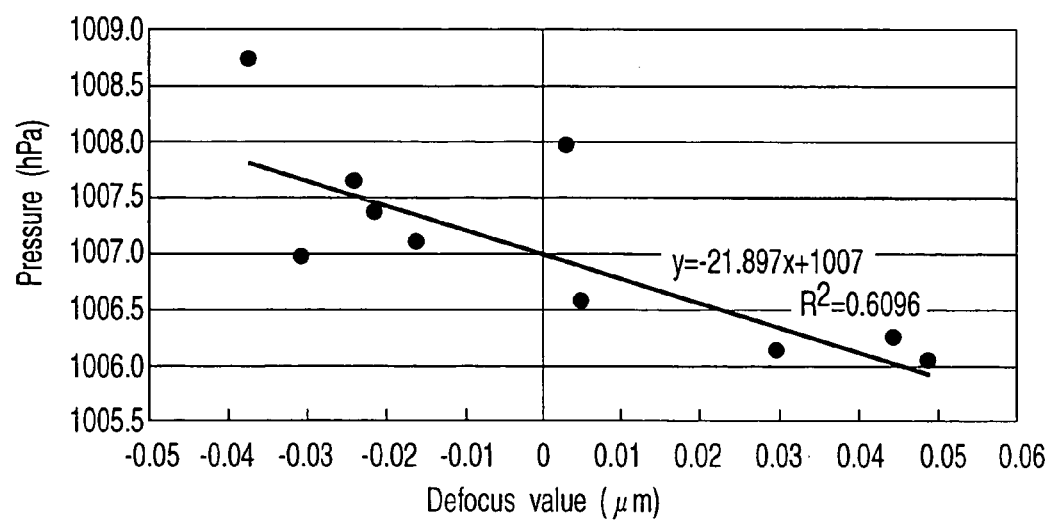
FIG. 6 is a view showing the defocus value for the measured pressure and the extracted linear relationship.

Steps S101 to S107 are repeated a number of times so that a sufficient amount of data is obtained to determine the pressure characteristic for the defocus value. When a sufficient amount of data is obtained, the extraction section 13 extracts a pressure-defocus characteristic of the, for example, a linear relationship, and the extraction interval is made variable (Step S108). FIG. 6 shows the defocus value for the measured pressure and the extracted linear relationship (second characteristic). The measured information, the calculated values and the extracted characteristics are recorded in the recording section (Step 109).

Subsequently, the steps performed after the atmosphere pressure-defocus value characteristic is obtained are described in the following. A wafer (second wafer) having a photo resist film formed on the surface thereof is conveyed into the chamber 21 of the exposure apparatus 20 and then the pressure in the chamber 21 is measured by using the pressure gauge 27 (Step S110). The measured pressure value is sent to the prediction section 14. The prediction section 14 predicts the defocus value corresponding to the measured pressure based on the pressure-defocus characteristic recorded in the recording section 11 (Step S111). The predicted defocus value is sent to the correction instruction section 15. The correction instruction section 15 calculates the focus correction value which does not affect the pattern dimensions, by using the predicted defocus value and sends instructions to the stage driving mechanism 26 (Step S112). The calculation and instruction interval for the focus correction value are variable. The stage driving mechanism 26 drives the wafer stage 25 based on the focus correction value, and adjusts the position of the wafer 24 in the height direction (Step S113).

Next, by transferring the focus monitor pattern and the device pattern to the photo resist film on the wafer 24, a latent image of the focus monitor pattern and the device pattern is formed on the photo resist film (Step S114). The wafer 24 is taken out of the chamber 21 and subjected to post-exposure baking (PEB) and developing processing, and the focus monitor mark comprising 2 types of diamond-shaped patterns and the actual device pattern are formed (Step S115).

Next, the lengths L and L' of the 2 types of focus monitor marks on the wafer that has been subjected to developing processing are measured by the inspection section 16 (Step S116). The results of the measurement are passed to the defocus value calculation section 12. The defocus value calculation section 12 obtains the difference ΔL (L−L') between the lengths of the 2 types of focus monitor marks that were measured (Step S117). The defocus value calculation section 12 then obtains the defocus value corresponding to the obtained dimension difference ΔL based on the dimension difference-defocus value characteristic recorded in the recording section 11 (Step S118). In the case where correction for the pressure value is not performed, the defocus value is recorded in the recording section 11 (Step S119). The defocus value in the case where the correction is not performed is the sum of the predicted defocus value and the defocus value obtained from the focus monitor mark. The extraction section 13 newly extracts pressure value— the defocus value characteristic by using the value set of the previously recorded pressure value and the defocus value and the value set of the newly recorded pressure value and the defocus value (Step S120). The newly extracted pressure-defocus value characteristic is recorded in the recording section 11 (Step S121).

Subsequently, the processes from Step S110 are repeated. In Step S111, the defocus value is predicted by using the newly extracted pressure-defocus value characteristic in Step S120. As a result, variations in the pressure-defocus value characteristic due to elapsed time can be handled, and more accurate defocus value predictions and defocus correction value calculations can be expected. Consequently, the quality of the product is improved and there is an increase in yield.

It is to be noted that it is time consuming if the above-described focus correction is done for each wafer, and thus it is preferable that the focus correction is carried out per lot in view of improving throughput. On the other hand, focus correction may be done for each exposure shot in view of further improving the focus correction accuracy.

In the embodiment described above, the dimensions of the focus monitor mark where measured, but the dimensions of the latent image of the focus monitor mark transferred to the photo resist film may also be measured instead. Also rather than obtaining the corresponding relationship between the dimension difference of the focus monitor mark or the latent image of the focus monitor mark and the focus position, the corresponding relationship between the dimension ratio and the focus position may be obtained.

It is to be noted that in the above-described embodiment, the pressure inside the chamber is measured. Normally, the chamber is an open system chamber and thus the atmosphere pressure and the pressure inside the chamber are approximately the same. Accordingly, the atmosphere pressure may be measured and the focus correction may be performed in accordance with the atmosphere pressure. In addition, the measurement of the pressure inside the chamber or the atmosphere pressure may be done when the wafer is not inside the chamber.

It is to be noted that the relationship between the shield film and the aperture in the first pattern region may be opposite to that of this embodiment. That is, the configuration may be such that the monitor pattern is formed of a diamond shape which is enclosed by the aperture or a diamond-shaped shield film. Similarly, the relationship between the translucence film and the aperture in the second pattern region may also be opposite to that of this embodiment. That is, the configuration may be such that the monitor pattern is formed of a diamond shape which is enclosed by the aperture or a diamond-shaped translucence film. In addition, any combination of these may be used to obtain the same results of this embodiment.

In this embodiment, the translucence film 202 which has a phase difference of 180 degrees is used in order to give the exposure light which passes through the periphery of the aperture 221 a phase difference of 90 degrees with respect to the exposure light which passes through the aperture 221, and a portion of the substrate is dug out. However, if a translucence film having a phase difference of 90 degrees is used digging becomes unnecessary. The phase difference between the exposure light which passes through the aperture 221 and the exposure light which passes through the periphery thereof is not limited to 90 degrees, and can be any phase difference that allows the best focus position change for the diamond-shaped pattern 211 of the shield film and the diamond-shaped pattern 221 of the translucence film.

Furthermore, the first aperture and second aperture in which the dug out amount is changed may be enclosed by the same translucence film and the exposure light which passes through the first translucence film may be caused to have a prescribed phase difference with respect to the exposure light that passes through the first aperture, and also the exposure light which passes through the second translucence film may be caused to have a phase difference with respect to the exposure light that passes through the second aperture, which differs from the aforementioned prescribed phase difference.

Also, the first aperture and second aperture may be enclosed by different translucence films, and the exposure light which passes through the first translucence film may be caused to have a prescribed phase difference with respect to the exposure light that passes through the first aperture, and also the exposure light which passes through the second translucence film may be caused to have a phase difference with respect to the exposure light that passes through the second aperture, which differs from the aforementioned prescribed phase difference.

It is to be noted that this exposure system does not need to have the inspection section 16. The length of the latent image of the focus monitor mark, or of the focus monitor mark may be measured with a SEM and the like which is not included in the exposure system, and the result of the measurement is passed to the defocus value calculation section 12 and the defocus value is thereby obtained.

In addition, the defocus correction is not limited to adjusting the position on the optical axis of the wafer. For example, in the case where the optical projection system has a function for adjusting the focus position, the optical projection system may be driven to adjust the focus position in order to carry out defocus correction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    preparing a photo mask on which first and second focus monitor patterns to form latent images of first and second focus monitor marks on a photo resist film, and a circuit pattern on a mask to form a latent image of the circuit pattern on the photo resist film are disposed;
    preparing first characteristics which show the defocus value characteristics of exposure light for a dimension difference or ratio of the latent image of the first focus monitor mark and the latent image of the second focus monitor mark, or a dimension difference or ratio of a first focus monitor mark and a second focus monitor mark obtained from developing the photo resist film on which the latent image for the marks are formed;
    disposing a first wafer on which the first photo resist film is formed inside an exposure chamber of an exposure apparatus;
    forming latent images of the first and second focus monitor marks on the first photo resist film;
    obtaining a first dimension difference or ratio which shows the dimension difference or ratio of the latent image of the first focus monitor mark and the latent image of the second focus monitor mark formed on the first photo resist film, or the dimension difference or ratio of a first focus monitor mark and a second focus monitor mark obtained by developing the first photo resist film on which the latent images are formed;
    calculating a first defocus value based on the first dimension difference or ratio and the first characteristics;
    calculating the first defocus value based on a plurality of atmosphere pressures or on a plurality of pressure states in the exposure chamber, and obtaining second characteristics showing defocus value characteristics for the atmosphere pressures or the pressure values inside the exposure chamber;
    disposing a second wafer on which the second photo resist film is formed, in the exposure chamber;
    measuring the atmosphere pressure or the pressure inside the exposure chamber either before or after the second wafer has been disposed;
    predicting the defocus value based on the measured pressure value and the second characteristics;
    correcting the relationship between a focus position of the exposure light and a position on the optical axis of the exposure light of the second resist film in accordance with the predicted defocus value; and
    forming the latent images of the first and second focus monitor marks and the latent image for the circuit pattern on the second photo resist film after the correction.

2. The method for manufacturing a semiconductor device, according to claim 1, further comprising:
    measuring the dimension difference or ratio of the latent image of the first focus monitor mark and the latent image of the second focus monitor mark formed on the second photo resist film on the second wafer, or the dimension difference or ratio of the first focus monitor mark and the second focus monitor mark obtained by developing the second photo resist film on which the latent image pattern is formed as a second dimension difference or ratio;

calculating a second defocus value corresponding to the measured second dimension difference or ratio based on the first characteristics;

obtaining new second characteristics for the defocus value corresponding to the atmosphere pressure or the pressure value for the pressure in the exposure chamber, based on a value set including the sum of the calculated second defocus value and the predicted defocus value and the atmosphere pressure or the pressure value for the pressure in the exposure chamber used in predicting the defocus value, and a value set including the atmosphere pressure or the pressure value for the pressure in the exposure chamber used in predicting the defocus value of the second characteristics and the defocus value.

3. The method for manufacturing a semiconductor device, according to claim 2, further comprising:

disposing a third wafer on which a third photo resist film is formed inside the exposure chamber;

measuring the atmosphere pressure or the pressure value for the pressure in the exposure chamber;

predicting the defocus value corresponding to the measured pressure value based on the new second characteristics;

correcting the relationship between a focus position of the exposure light and a position on the optical axis of the exposure light of the third resist film in accordance with the predicted defocus value; and transferring the first and second focus monitor patterns formed on the photo mask and the circuit pattern to the third photo resist film on the third wafer in a state in which the focus position has been corrected.

4. The method for manufacturing a semiconductor device, according to claim 1, wherein the first focus monitor pattern is formed of a first aperture enclosed by a shield film or a shield film enclosed by a first aperture, and the second focus monitor pattern is formed of a second aperture enclosed by a translucence film or a translucence film enclosed by a second aperture, and the exposure light which passes through the translucence film has a predetermined phase difference with respect to the exposure light which passes through the second aperture.

5. The method for manufacturing a semiconductor device, according to claim 1, wherein the first focus monitor pattern is formed of a first translucence film enclosed by a first aperture, or of a first aperture enclosed by a first translucence film, and the exposure light which passes through the first translucence film has a predetermined phase difference with respect to the exposure light which passes through the first aperture, and the second focus monitor pattern is formed of a second translucence film enclosed by a second aperture, or of a second aperture enclosed by a second translucence film, and the exposure light which passes through the second translucence film has a phase difference with respect to the exposure light which passes through the second aperture, the phase difference being different from aforementioned predetermined phase difference.

6. The method for manufacturing a semiconductor device, according to claim 1, wherein the correction is changing the position of the second wafer on the optical axis of the exposure light.

7. The method for manufacturing a semiconductor device, according to claim 1, wherein the correction is changing the focus position of the exposure light.

8. The method for manufacturing a semiconductor device, according to claim 1, wherein the correction is performed for each lot.

9. The method for manufacturing a semiconductor device, according to claim 1, wherein the correction is performed for each shot.

10. An exposure system comprising:

a storage section which stores first characteristics which show defocus value characteristics for a dimension difference or ratio of latent images of first and second focus monitor marks which are obtained by transferring first and second focus monitor patterns to a photo resist film, or defocus value characteristics of exposure light for a dimension difference or ratio of the first and second focus monitor marks obtained by developing the photo resist film on which the latent image for the mark is formed, with respect to the photo mask on which first and second focus monitor patterns and a circuit pattern are disposed;

an exposure apparatus comprising an exposure chamber in which a light source of the exposure light, a mask stage for mounting the photo mask; an optical projection system; and a wafer stage for mounting the wafer are accommodated, and an adjustment mechanism which adjusts the relationship between the focus position of the exposure light and the position on the optical axis of the exposure light source of the wafer;

a pressure gauge configured to measure the atmosphere pressure or the pressure inside the exposure chamber;

a defocus value calculation section configure to calculate a defocus value corresponding to the dimension difference or ratio of the first and second focus monitor latent image patterns formed on the photo resist film on the wafer, or to the dimension difference or ratio of the first and second focus monitor marks, based on the first characteristic recorded in the storage section;

an extraction section configured to extract second characteristics for the defocus value corresponding to the pressure value, based on a plurality of pairs of data sets of the pressure value measured by the pressure gauge and the defocus value calculated by the defocus value calculation section;

a prediction section configured to predict the defocus value corresponding to the pressure value measured by the pressure gauge based on the second characteristics extracted by the extraction section; and a correction instruction section configured to calculate a correction value from the defocus value predicted by the prediction section and gives correction value instructions to the adjustment mechanism.

11. The exposure system according to claim 10, wherein the extraction section has a function for extracting new second characteristics for the defocus value corresponding to the pressure value, based one pair or more of data sets including the sum of the defocus value predicted by the prediction section and the defocus value calculated by the defocus value calculation section after the position of the wafer stage is adjusted based on the defocus correction value, and the pressure value measured by the pressure gauge, and a plurality of pairs of the pressure value used when extracting the second characteristics and the defocus value.

12. The exposure system according to claim 10, further comprising a inspection section which measures the dimensions of the first and second focus monitor latent image patterns or the dimensions of the first and second focus monitor marks.

13. The exposure system according to claim 10, wherein the wafer stage has a function for adjusting the position of the optical axis on the wafer, and the adjusting mechanism drives the wafer stage in accordance with the correction value and adjusts the position of the wafer on the optical axis.

14. The exposure system according to claim 10, wherein the optical projection system has a function for adjusting the focus position of the exposure light, and the adjustment mechanism drives the optical projection system in accordance with the correction value and adjusts the focus position.

\* \* \* \* \*

UNITED STATES PATENT AND TRADEMARK OFFICE
CERTIFICATE OF CORRECTION

PATENT NO.         : 7,079,219 B2                                    Page 1 of 1
APPLICATION NO. : 10/932077
DATED              : July 18, 2006
INVENTOR(S)        : Masahiro Kanno It is certified that error appears in the above-identified patent and that said Letters Patent is hereby corrected as shown below:

Column 10, line 33, change "configure" to --configured--.

Signed and Sealed this

Seventeenth Day of October, 2006

JON W. DUDAS
*Director of the United States Patent and Trademark Office*